United States Patent
Leung et al.

(10) Patent No.: US 7,327,172 B2
(45) Date of Patent: Feb. 5, 2008

(54) INTEGRATED CLOCK GENERATOR WITH PROGRAMMABLE SPREAD SPECTRUM USING STANDARD PLL CIRCUITRY

(75) Inventors: Ho-Ming Leung, Cupertino, CA (US); Elliot Sowadsky, San Jose, CA (US); Eric Hung, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 11/167,629

(22) Filed: Jun. 27, 2005

(65) Prior Publication Data

US 2006/0290391 A1    Dec. 28, 2006

(51) Int. Cl.
*H03L 7/06* (2006.01)

(52) U.S. Cl. ........................ 327/147; 327/156

(58) Field of Classification Search ................ 327/147, 327/154, 155, 156, 162, 163; 331/17, 25, 331/DIG. 2; 375/373–376
See application file for complete search history.

(56) References Cited

U.S. PATENT DOCUMENTS

| | | | | |
|---|---|---|---|---|
| 4,179,670 A | * | 12/1979 | Kingsbury | .................... 331/10 |
| 5,604,468 A | * | 2/1997 | Gillig | ......................... 331/176 |
| 7,079,616 B2 | * | 7/2006 | Castiglione et al. | ........ 375/376 |
| 7,109,764 B2 | * | 9/2006 | Sakamoto et al. | .......... 327/156 |
| 2005/0180490 A1 | * | 8/2005 | Hattori | ....................... 375/130 |

* cited by examiner

*Primary Examiner*—Linh My Nguyen
(74) *Attorney, Agent, or Firm*—Christopher P. Maiorana, PC

(57) ABSTRACT

An apparatus comprising a phase lock loop circuit and a control circuit. The phase lock loop circuit configured to generate an output signal having a first frequency in response to (i) an input signal having a second frequency, (ii) a first divider value and (iii) a second divider value. The second divider value may control spread spectrum modulation of the phase lock loop circuit. The control circuit configured to generate the second divider value in response to (i) the output signal and (ii) a programmable control signal.

20 Claims, 3 Drawing Sheets

INTEGRATED CLOCK GENERATOR WITH PROGRAMMABLE SPREAD SPECTRUM USING STANDARD PLL CIRCUITRY

FIELD OF THE INVENTION

The present invention relates to clock generation circuits generally and, more particularly, to a method and/or apparatus for implementing an integrated clock generator with programmable spread spectrum using analog PLL circuitry.

BACKGROUND OF THE INVENTION

Conventional integrated circuits use clock generator circuits to generate clock signals. Such clock generator circuits are often implemented having either fixed spectrum characteristic or no spread spectrum capability at all.

It would be desirable to implement a clock generation circuit that would (i) reduce electromagnetic interference (EMI) energy, (ii) have a better chance to meet FCC standards than a system without the present invention and/or (iii) be implemented at a lower cost than conventional clock generators.

SUMMARY OF THE INVENTION

The present invention concerns an apparatus comprising a phase lock loop circuit and a control circuit. The phase lock loop circuit may be configured to generate an output signal having a first frequency in response to (i) an input signal having a second frequency, (ii) a first divider value and (iii) a second divider value. The second divider value may control spread spectrum modulation of the phase lock loop circuit. The control circuit may be configured to generate the second divider value in response to (i) the output signal and (ii) a programmable control signal.

The objects, features and advantages of the present invention include providing a clock generator circuit that may (i) provide spread spectrum characteristics programmable by software, (ii) be adapted to the characteristics of a final product implementation (e.g., DRAM usage, operating frequency, product enclosure etc.), (iii) be implemented without special analog control circuits and/or (iv) use an existing fractional PLL that may be controlled with simple digital logic.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
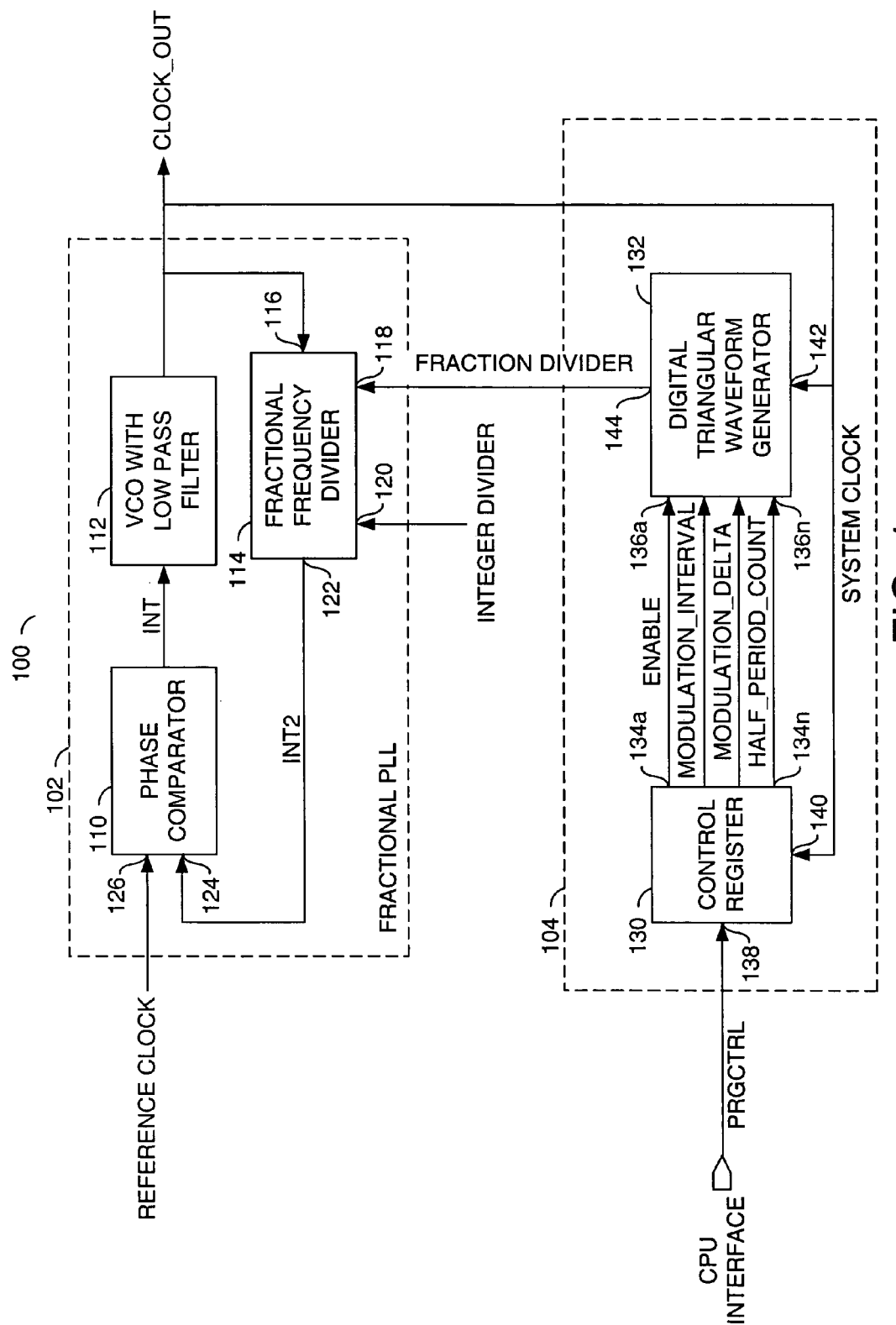
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a programmable spread spectrum clock generator. The circuit 100 generally comprises a phase lock loop (PLL) portion 102 and a control portion 104. The PLL portion 102 generally comprises a block (or circuit) 110, a block (or circuit) 112 and a block (or circuit) 114. The circuit 110 may be implemented as a phase comparator circuit. The circuit 112 may be implemented as a voltage controlled oscillator (VCO) with a low pass filter. The circuit 114 may be implemented as a frequency divider circuit.

The phase comparator 110 may generate a signal (e.g., INT) that may be presented to the circuit 112. The circuit 112 generally generates an output signal (e.g., CLOCK_OUT). The signal CLOCK_OUT is generally a clock signal that oscillates at a particular frequency. The divider circuit 114 may have an input 116 that may receive a signal CLOCK_OUT, an input 118 that may receive a signal (e.g., FRACTION_DIVIDER), an input 120 that may receive a signal (e.g., INTEGER_DIVIDER), and an output 122 that may generate a signal (e.g., INT2). The phase comparator 110 may have an input 124 that may receive the signal INT2 and an input 126 may receive a signal (e.g., REFERENCE_CLOCK). The signal REFERENCE_CLOCK may be an input signal that oscillates at a particular frequency. The signal REFERENCE_CLOCK may be generated externally from the circuit 102.

The control circuit 104 generally comprises a block (or circuit) 130 and a block (or circuit) 132. The circuit 130 may be implemented as a register circuit. In one example, the circuit 130 may be a control register. The circuit 132 may be a waveform generator circuit. In one example, the circuit 132 may be implemented as a digital triangular waveform generator. The circuit 130 may have a number of outputs 130a–130n that may present a number of control signals to a number of inputs 136a–136n of the circuit 132. The control signals may include a signal (e.g., ENABLE), a signal (e.g., MODULATION_INTERVAL), a signal (e.g., MODULATION_DELTA) and a signal (e.g., HALF_PERIOD_COUNT). The circuit 130 may also have an input 138 that may receive a signal (e.g., PRGCTRL). The signal PRGCTRL may be a programmable control signal that may be received from a CPU interface. The circuit 130 may also have an input 140 that may receive the signal CLOCK_OUT from the circuit 102. The signal CLOCK_OUT may also be referred to as a system clock. The circuit 132 may also have an input 142 that may receive the signal CLOCK_OUT. The circuit 132 may have an output 144 that may present the signal FRACTION_DIVIDER.

The PLL circuit 102 may be implemented as an analog fractional PLL. The PLL circuit 102 may be considered fractional since the divide value may be implemented as a value other than an integer. For example, the clock signal REFERENCE_CLOCK may be implemented as a 13.5 MHZ XTAL oscillator signal. The target value for the signal CLOCK OUT may be 200 MHZ (e.g., value typically used as the clock of DDR400 type synchronous dynamic random access memory (SDRAM) system). In such an example, the divide ratio of the PLL circuit 102 may be 200/13.5, or 14.81481481 (e.g., a fraction of an integer). However, other divide ratios may be implemented to meet the design criteria of a particular implementation.

The signal FRACTIONAL_DIVIDER may be generated by the circuit 132. The circuit 132 may be a sigma delta noise shaping circuit. In one example, the circuit 132 may be implemented as a digital triangular waveform generator. The circuit 132 is normally configured to modulate the signal FRACTIONAL_DIVIDER (to be described in more detail in connection with FIG. 2) to eliminate spurious noise generated by the system 100. By reducing and/or eliminating spurious noise, other circuitry implemented in close proximity to the system 100 may operate more efficiently and/or without interference.

Figure 2:
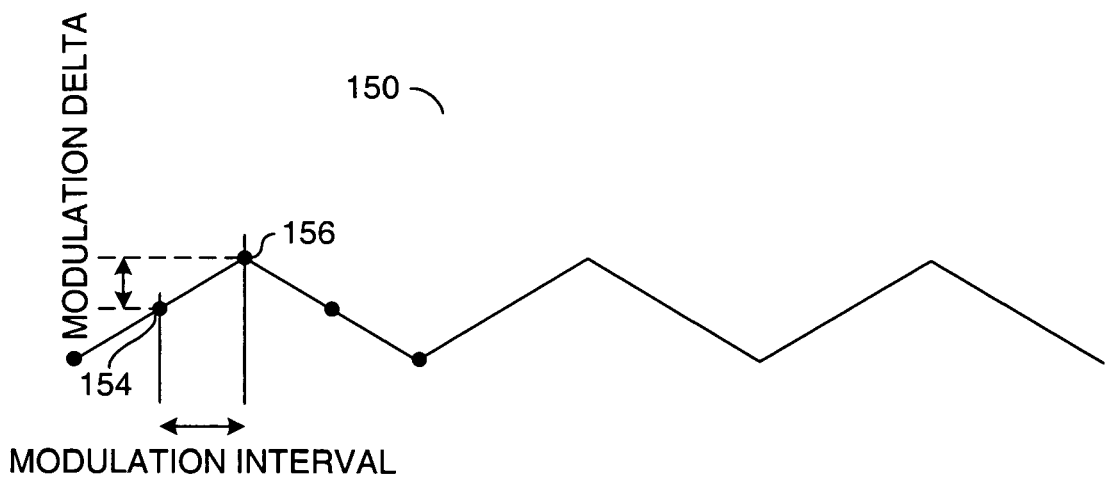
FIG. 2 is a waveform illustrating a modulation interval.

Referring to FIG. 2, an example of a modulation waveform 150 is shown. The modulation waveform 150 is shown having a generally triangular shape. The value MODULATION_DELTA is shown between a zero point 154 of the waveform 150 and a point 156 at the highest peak, measured in the vertical direction. The value MODULATION_INTERVAL is shown between the zero point 152 and the highest peak 156, measured in a horizontal direction. The value MODULATION_DELTA and the value MODULATION_INTERVAL may be controlled by the circuit 132. FIG. 2 graphically illustrates the value MODULATION_DELTA and the value MODULATION_INTERVAL. However, FIGS. 1 and 3 illustrate the digital signals MODULATION_INTERVAL and MODULATION_DELTA as digital signals configured to control the modulation waveform 150.

Figure 3:
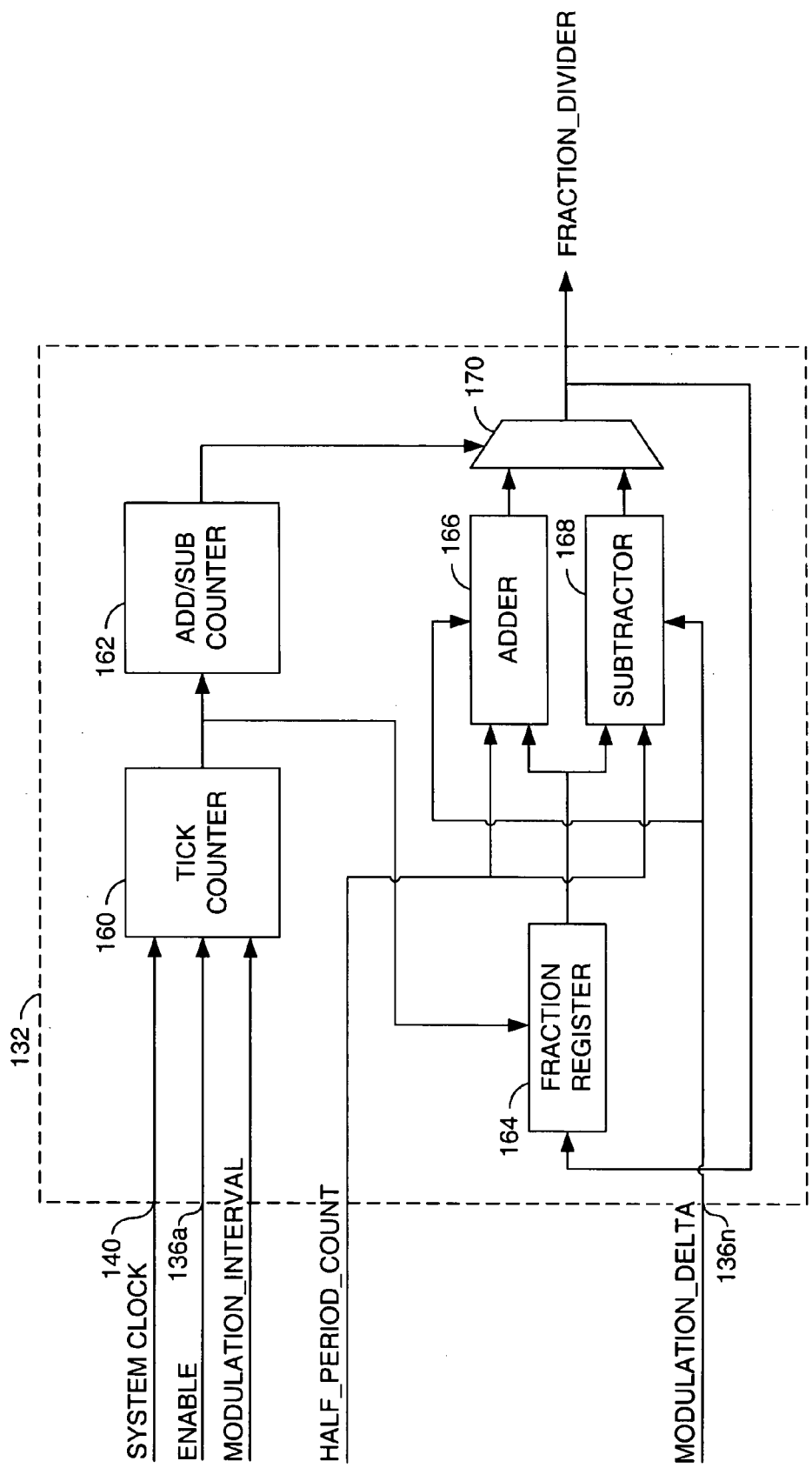
FIG. 3 is a diagram of the waveform generator of FIG. 2.

Referring to FIG. 3, a more detailed diagram of the circuit 132 is shown. The circuit 132 generally comprises a block (or circuit) 160, a block (or circuit) 162, a block (or circuit) 164, a block (or circuit) 164, a block (or circuit) 166, a block (or circuit) 168 and a block (or circuit) 170. The circuit 160 generally comprises a counter circuit. In one example, the circuit 160 may be implemented as a tick counter circuit. The circuit 162 may also be implemented as a counter circuit. In one example, the circuit 162 may be implemented as an adder/subtractor counter circuit. The circuit 164 may be implemented as a register. In one example, the circuit 164 may be implemented as a fraction register circuit. The circuit 166 may be implemented as an adder circuit. The circuit 168 may be implemented as a subtractor circuit. The circuit 170 may be implemented as a multiplexer.

The circuit 132 is generally implemented as an accumulator type logic configured to control the fractional portion of the divider circuit 114. The signal FRACTION_DIVIDER represents a triangular waveform. The parameters of the waveform 150 may be programmable by adding or subtracting a delta to a fractional number calculated over a certain period. The signal FRACTIONAL_DIVIDER is normally a constant periodic signal. The relatively low frequency of the signal FRACTIONAL_DIVIDER may be used to modulate the frequency of the signal CLOCK_OUT. In general, the spectrum of the frequencies generated by the PLL circuit 102 are spread over a range of frequencies. By modulating (or jittering) the frequency of the signal CLOCK_OUT, the electromagnetic interface (EMI) energy is not concentrated on a fixed frequency, but rather spread over a range broader frequency. Each of the frequencies in the range normally has a reduced amplitude compared with a single frequency (e.g., non-spread spectrum) design.

The modulation waveform 150 is programmable by the value of the signal MODULATION INTERVAL and the signal MODULATION_DELTA. The signal MODULATION_INTERVAL represents the number of system clock ticks between which the fraction would be added or subtracted with the modulation delta. For example, when the fraction is 0.81481481, a 5% of modulation may be created by using fraction numbers changing between 0.81481481*0.975 to 0.81481481*1.025. The signal HALF_ PERIOD_COUNT defines how many times adding would be carried out before the circuit 132 switches to subtraction. In FIG. 2, the signal HALF_PERIOD COUNT is shown as 2, meaning the fractional divider 114 would be incremented twice and then decremented twice. The combined effect of the signal HALF_PERIOD_COUNT and the signal MODULATION_INTERVAL may be used to control the frequency of modulation, typically set to between 20 Khz and 100 Khz.

The waveform generator 132 may be implemented as a digital circuit. The tick counter 160 may be used to divide the signal SYSTEM_CLOCK by an amount specified by the signal MODULATION_INTERVAL. The fractional divider 114 would be updated once for every tick of the signal MODULATION_INTERVAL. The adder 166 normally continues to add to the signal FRACTIONAL_DIVIDER by the value of the signal MODULATION_DELTA for consecutive iterations of the signal HALF_PERIOD_COUNT. The add/sub counter 162 normally keeps track of how many times the addition/subtraction has occurred. When the counter 162 has reached a number equal to the value of the signal HALF_PERIOD_COUNT, then the counter 162 generates a signal that switches the multiplexer 170 to switch from an add mode to a subtract mode, and vice versa. Thus, the shape of the signal FRACTIONAL_DIVIDER is a periodic triangular waveform.

All the control values of the triangular wave 150 are programmable (e.g., by a CPU). The spectrum characteristic is variable and may be adapted to different applications. For a low cost system, the present invention may be implemented in an inexpensive plastic box which may lead to EMI leaking. In an SDRAM system, lower performance may be implemented that could withstand a larger amount of jitter. In such case, the amplitude of the spread spectrum may be programmed to a large value by using a large value of the signal MODULATION_DELTA. Also, the triangular waveform 150 may be programmed to a high frequency by using a small modulation interval. For high performance system, the product enclosure box may be a more expensive metal box resulting in less EMI wave leakage. Such a SDRAM system may be also higher performance, operating at higher frequencies and may not withstand a large amount of jitter. In such case, the signal MODULATION_INTERVAL may be larger (e.g., lower jitter) and the signal MODULATION_DELTA may be smaller (e.g., small amount jitter).

The present invention may have a simple implementation. The present invention may use several elements from an existing fractional PLL without complicated analog circuit development. The triangular wave generator 132 may be implemented with simple digital logic constructed by simple adder, subtractor, counters and/or small amount of random logic. The present invention may implement a spread spectrum clock built on the same silicon as consumer electronic integrated circuit (such as an encoder or other circuit) and thus eliminate the need for an expensive external dedicated spread spectrum clock generator.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a phase lock loop circuit configured to generate an output signal having a first frequency in response to (i) an input signal having a second frequency, (ii) a first divider value and (iii) a second divider value, wherein said second divider value controls spread spectrum modulation of said phase lock loop circuit; and
    a control circuit configured to generate said second divider value in response to (i) said output signal and (ii) a programmable control signal, wherein said phase lock loop circuit comprises a fractional frequency divider circuit configured to generate an intermediate signal in response to said first divider value, said second divider value and said output signal.

2. The apparatus according to claim 1, wherein said first divider value comprises an integer divider and said second divider value comprises a fractional divider signal.

3. The apparatus according to claim 1, wherein said phase lock loop further comprises a phase comparator circuit configured to generate an intermediate signal in response to said input signal and said intermediate signal.

4. The apparatus according to claim 3, wherein said phase lock loop circuit further comprises a filter circuit configured to generate said output signal in response to said intermediate signal from said phase comparator circuit.

5. The apparatus according to claim 1, wherein said control circuit further comprises a waveform generator circuit configured to generate said second divider value in response to said output signal and a plurality of control signals.

6. The apparatus according to claim 5, wherein said control circuit further comprises a control register configured to generate said control signals in response to said output signal and a programmable control signal.

7. The apparatus according to claim 1, wherein said spread spectrum modulation comprises a triangular shaped modulation.

8. The apparatus according to claim 6, wherein said control signals further comprises (i) a modulation interval signal, (ii) a modulation delta signal, (iii) a half period count signal and (iv) an enable signal.

9. The apparatus according to claim 8, wherein a triangular shaped modulation is programmable based on one or more values of said modulation interval signal and said modulation delta signal.

10. The apparatus according to claim 9, wherein said control register further comprises:
a tick counter configured to divide said output signal by an amount specified by said modulation interval signal;
an adder configured to continuously add said second divider value to said modulation delta signal consecutively by an amount specified by said half period count signal;
a counter configured to track addition and subtraction operations when said counter has achieved an amount specified by said half period count signal; and
a multiplexer configured to switch between said adder and a subtractor in response to said counter.

11. An apparatus comprising:
means for generating an output signal having a first frequency in response to (i) an input signal having a second frequency, (ii) a first divider value and, (iii) a second divider value, wherein said second divider value controls spread spectrum modulation of said means for generating said output signal; and
means for generating said second divider value in response to (i) said output signal and (ii) a programmable control signal, wherein said means for generating said output signal comprises a fractional frequency divider circuit configured to generate an intermediate signal in response to said first divider value, said second divider value and said output signal.

12. A method implementing a spread spectrum phase lock loop comprising:
(A) generating an output signal having a first frequency in response to (i) an input signal having a second frequency, (ii) a first divider value and (iii) a second divider value, wherein said second divider value controls spread spectrum modulation of a phase lock loop circuit; and
(B) generating said second divider value in response to (i) said output signal and (ii) a programmable control signal, wherein step (A) generates said output signal using a fractional frequency divider circuit configured to generate an intermediate signal in response to said first divider value, said second divider value and said output signal.

13. An apparatus comprising:
a phase lock loop circuit configured to generate an output signal having a first frequency in response to (i) an input signal having a second frequency, (ii) a first divider value and (iii) a second divider value, wherein said second divider value controls spread spectrum modulation of said phase lock loop circuit; and
a control circuit configured to generate said second divider value in response to (i) said output signal and (ii) a programmable control signal, wherein said control circuit further comprises a waveform generator circuit configured to generate said second divider value in response to said output signal and a plurality of control signals.

14. The apparatus according to claim 13, wherein said first divider value comprises an integer divider and said second divider value comprises a fractional divider signal.

15. The apparatus according to claim 13, wherein said phase lock loop further comprises a phase comparator circuit configured to generate an intermediate signal in response to said input signal and said intermediate signal.

16. The apparatus according to claim 15, wherein said phase lock loop circuit further comprises a filter circuit configured to generate said output signal in response to said intermediate signal from said phase comparator circuit.

17. The apparatus according to claim 13, wherein said control circuit further comprises a waveform generator circuit configured to generate said second divider value in response to said output signal and a plurality of control signals.

18. The apparatus according to claim 13, wherein said spread spectrum modulation comprises a triangular shaped modulation.

19. The apparatus according to claim 18, wherein said control signals further comprises (i) a modulation interval signal, (ii) a modulation delta signal, (iii) a half period count signal and (iv) an enable signal.

20. The apparatus according to claim 19, wherein a triangular shaped modulation is programmable based on one or more values of said modulation interval signal and said modulation delta signal.

* * * * *